(12) United States Patent
Sari et al.

(10) Patent No.: US 12,339,407 B2
(45) Date of Patent: Jun. 24, 2025

(54) DEVICE FOR DETECTING CHARGED PARTICLES OR RADIATION

(71) Applicant: Hitachi High-Tech Corporation, Tokyo (JP)

(72) Inventors: Laila Ambar Sari, Tokyo (JP); Shin Imamura, Tokyo (JP); Takumu Iwanaka, Tokyo (JP); Yoshifumi Sekiguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 212 days.

(21) Appl. No.: 17/926,951

(22) PCT Filed: Jun. 17, 2020

(86) PCT No.: PCT/JP2020/023741
§ 371 (c)(1),
(2) Date: Nov. 21, 2022

(87) PCT Pub. No.: WO2021/255853
PCT Pub. Date: Dec. 23, 2021

(65) Prior Publication Data
US 2023/0266485 A1 Aug. 24, 2023

(51) Int. Cl.
*G01T 1/20* (2006.01)

(52) U.S. Cl.
CPC .......... *G01T 1/2018* (2013.01); *G01T 1/2002* (2013.01)

(58) Field of Classification Search
CPC . G01T 1/2018; G01T 1/2002; G01T 1/20183; G01T 1/20188; H01J 2237/2443; H01J 2237/2446; H01J 37/244
See application file for complete search history.

(56) References Cited

U.S. PATENT DOCUMENTS

| 8,467,644 B1 * | 6/2013 | Kim ..................... G01T 1/20183 |
| | | 362/610 |
| 2007/0069141 A1 | 3/2007 | Nittoh et al. |

(Continued)

FOREIGN PATENT DOCUMENTS

| CN | 112133717 A | * 12/2020 | ........... H04N 25/709 |
| GB | 1003220 A | * 9/1965 | ........... G01T 1/2002 |

(Continued)

OTHER PUBLICATIONS

Office Action issued in corresponding Japanese Patent Application No. 2022-531165, dated Nov. 7, 2023 (7 pages).

(Continued)

*Primary Examiner* — Edwin C Gunberg
*Assistant Examiner* — Richard O Toohey
(74) *Attorney, Agent, or Firm* — Foley & Lardner LLP

(57) ABSTRACT

A charged-particle detecting device 108, 108a, 108b, 108c, 108d, 108e, 108f, 108g or a radiation detecting device 203 detects charged particles or radiation as a detection target. These detection devices are each provided with: a scintillator 109 provided with a fluorescent layer 109a that converts the detection target into light 112; a light detector 111, 111b that detects the light 112 emitted from the scintillator 109; a light guide 110, 117 provided between the scintillator 109 and the light detector 111, 111b; and a blocking part 113, 114 that blocks a portion of the detection target incident on the scintillator 109 or the light emitted from the scintillator 109.

19 Claims, 13 Drawing Sheets

(56) References Cited

U.S. PATENT DOCUMENTS

| | | | |
|---|---|---|---|
| 2008/0111083 A1* | 5/2008 | Kondo | G01T 1/202 250/370.11 |
| 2012/0126126 A1* | 5/2012 | Yokoyama | G01T 1/2928 250/361 R |
| 2013/0211233 A1 | 8/2013 | Yamaya et al. | |
| 2015/0285923 A1 | 10/2015 | Tonami | |
| 2017/0192105 A1* | 7/2017 | Hamano | G01T 1/20 |
| 2017/0205514 A1 | 7/2017 | Yasui et al. | |
| 2018/0188387 A1* | 7/2018 | Morimoto | G01T 1/2002 |
| 2019/0369270 A1* | 12/2019 | Kunimoto | G01T 1/006 |

FOREIGN PATENT DOCUMENTS

| | | | | | |
|---|---|---|---|---|---|
| JP | H0587934 A | * | 4/1993 | | |
| JP | 2002296351 A | * | 10/2002 | | |
| JP | 2003-014850 A | | 1/2003 | | |
| JP | 2005-106541 A | | 4/2005 | | |
| JP | 2008-051626 A | | 3/2008 | | |
| JP | 2009-053104 A | | 3/2009 | | |
| JP | 2009-085776 A | | 4/2009 | | |
| JP | 2009222578 A | * | 10/2009 | | |
| JP | 2014-032029 A | | 2/2014 | | |
| JP | 2014153213 A | * | 8/2014 | | G01T 1/249 |
| JP | 2014-196998 A | | 10/2014 | | |
| JP | 2016-118390 A | | 6/2016 | | |
| WO | WO-2012/056504 A1 | | 5/2012 | | |

OTHER PUBLICATIONS

International Search Report with English Translation and Written Opinion in International Application No. PCT/JP2020/023741 dated Sep. 8, 2020.
Office Action issued in corresponding Japanese Application No. 2022-531165, dated Mar. 26, 2024 (8 pages).

* cited by examiner

[FIG. 1]
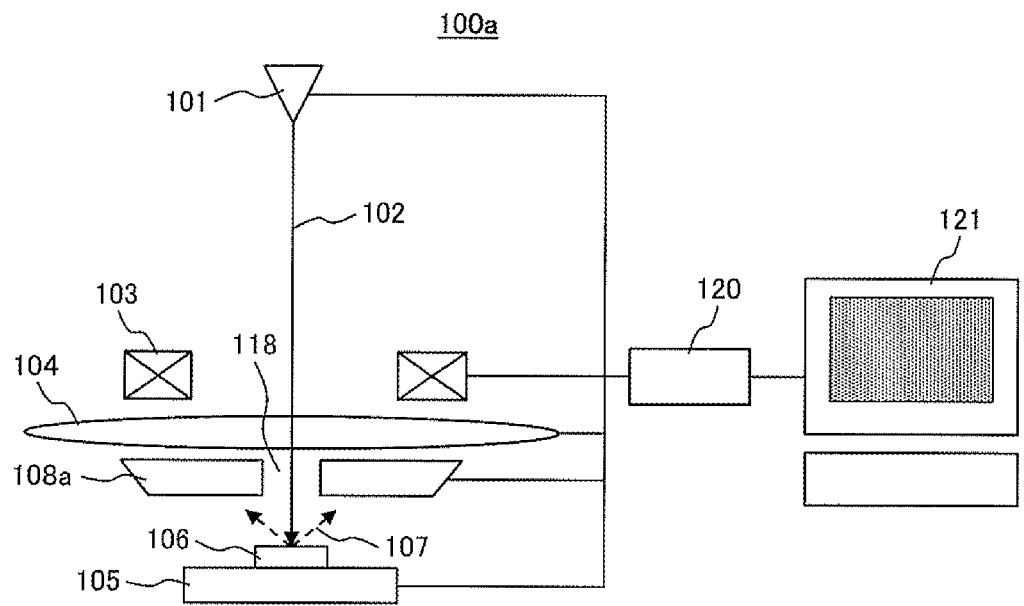
[FIG. 2A]
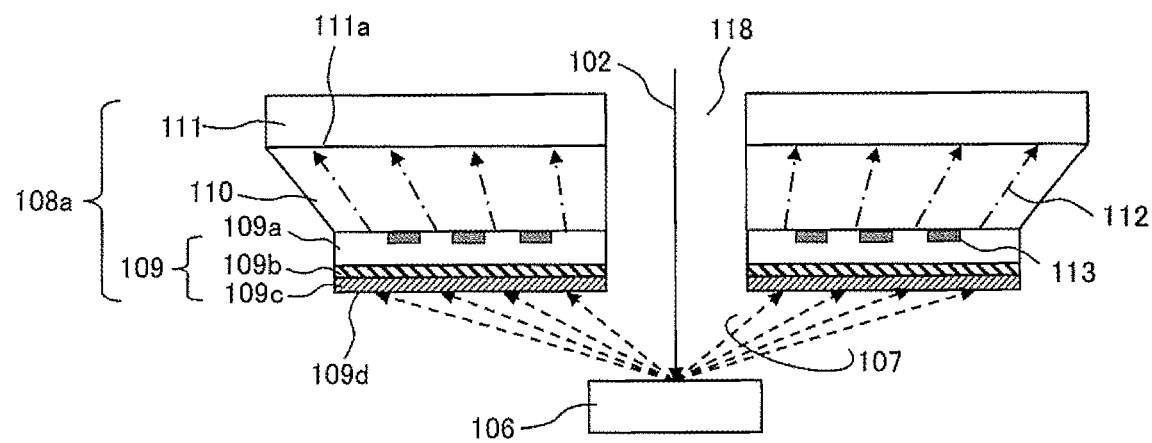

[FIG. 2B]
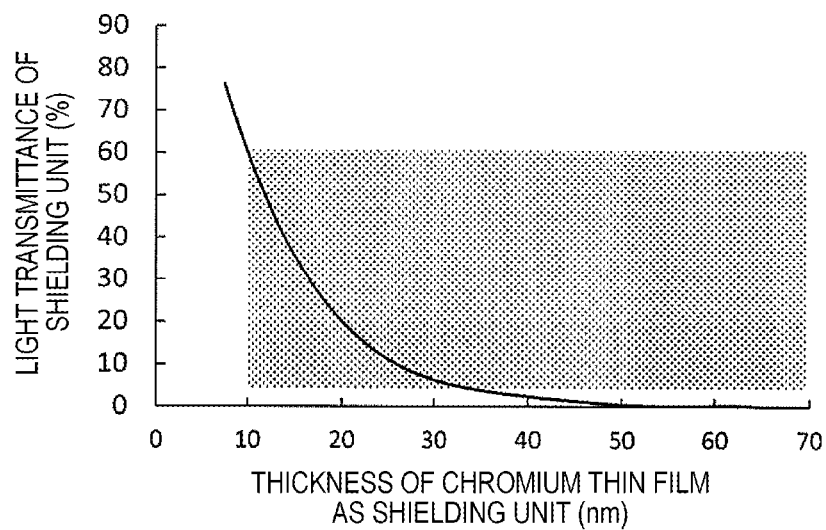
[FIG. 3A]
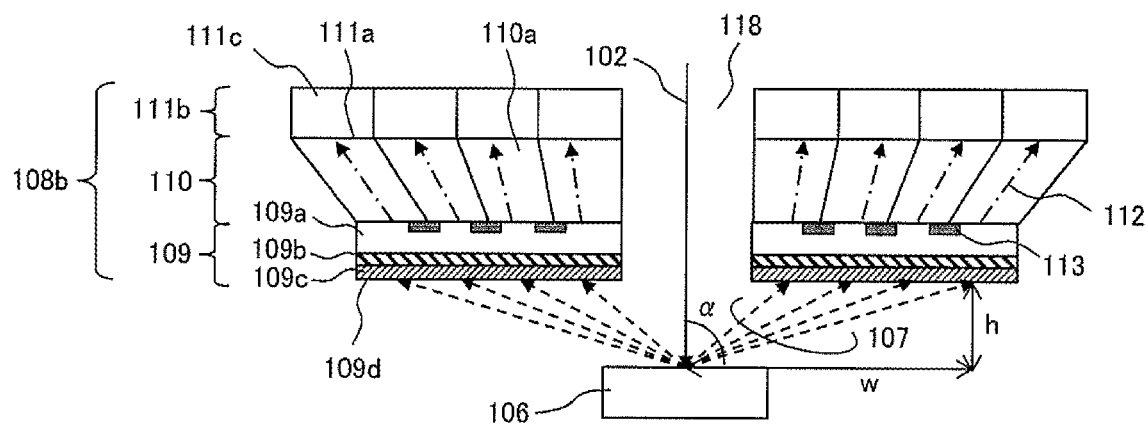

[FIG. 3B]
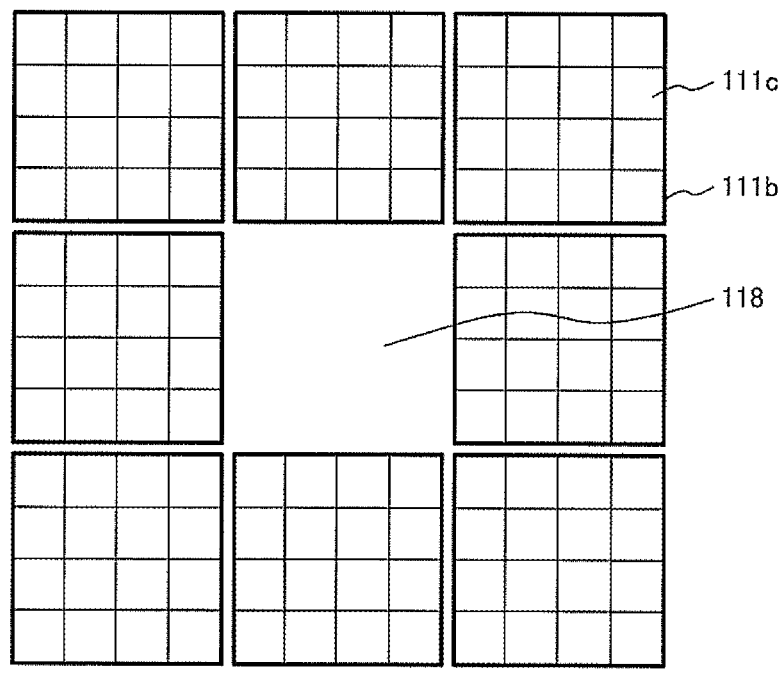
[FIG. 3C]
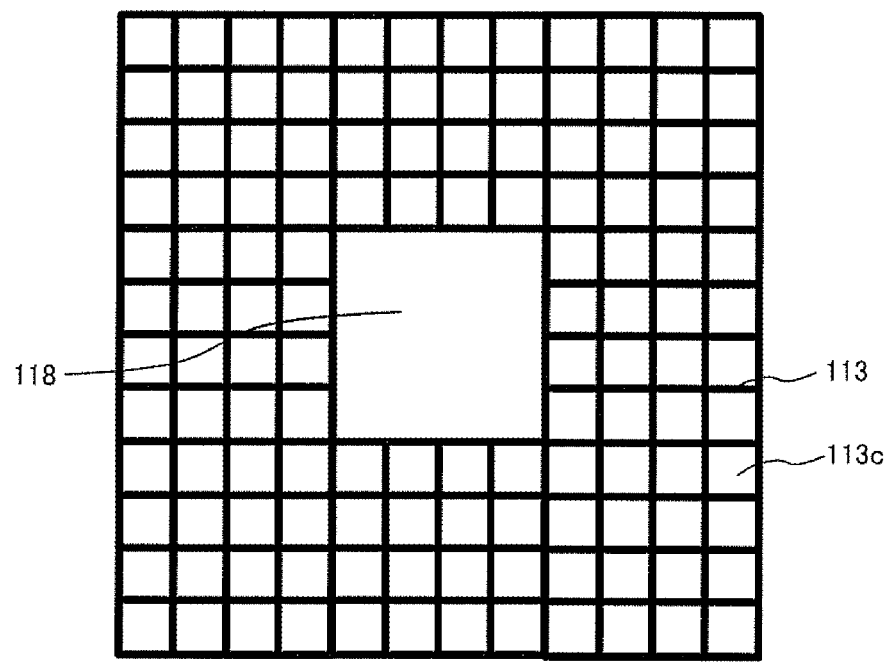

[FIG. 3D]
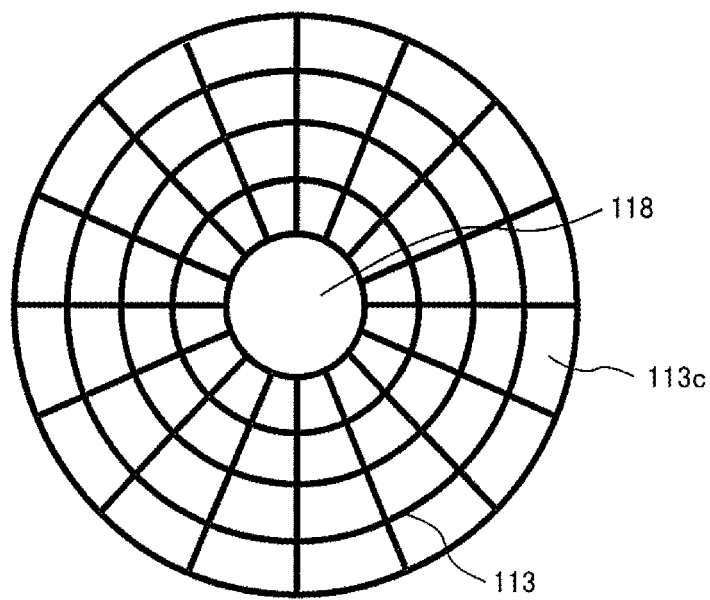
[FIG. 3E]
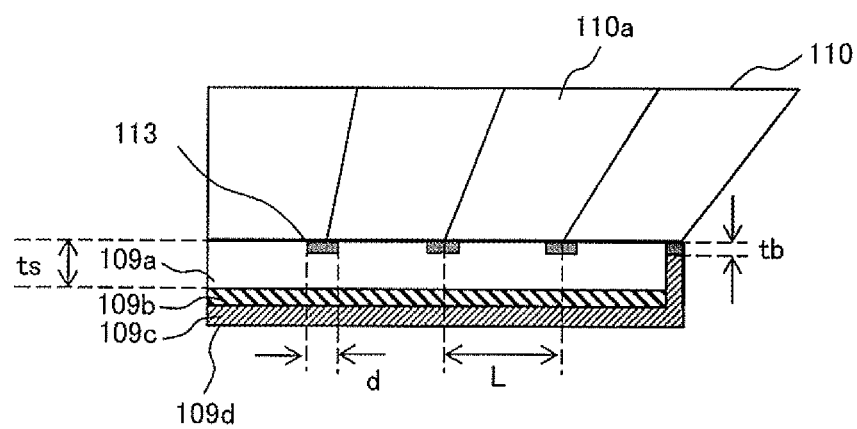

[FIG. 3F]
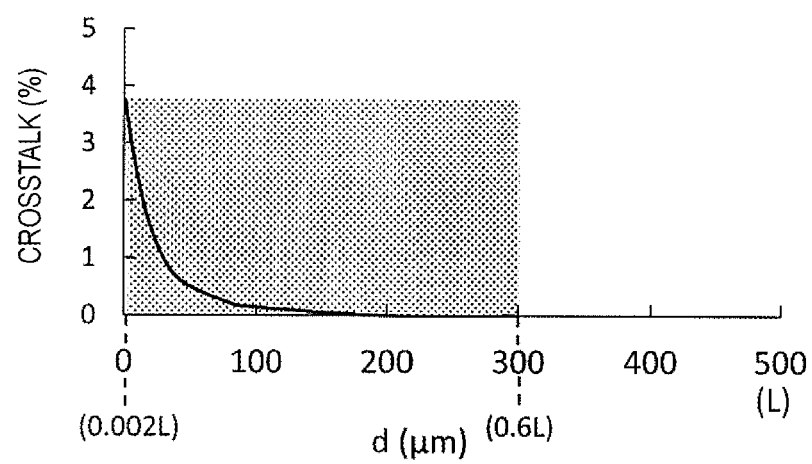
[FIG. 3G]
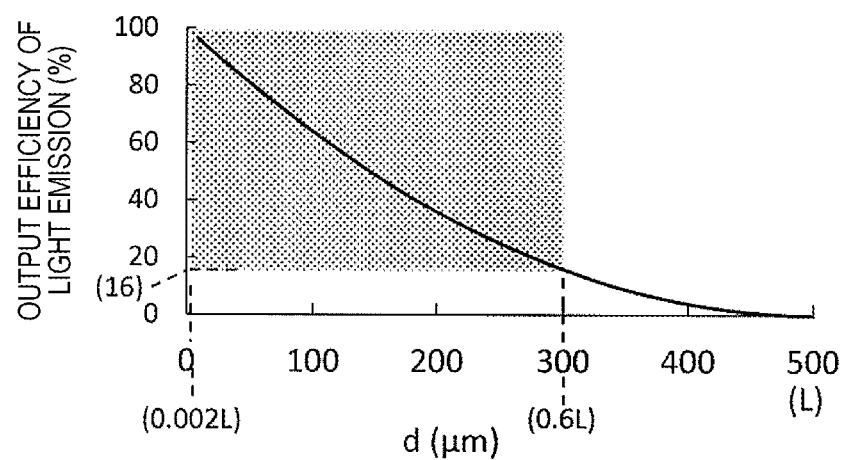

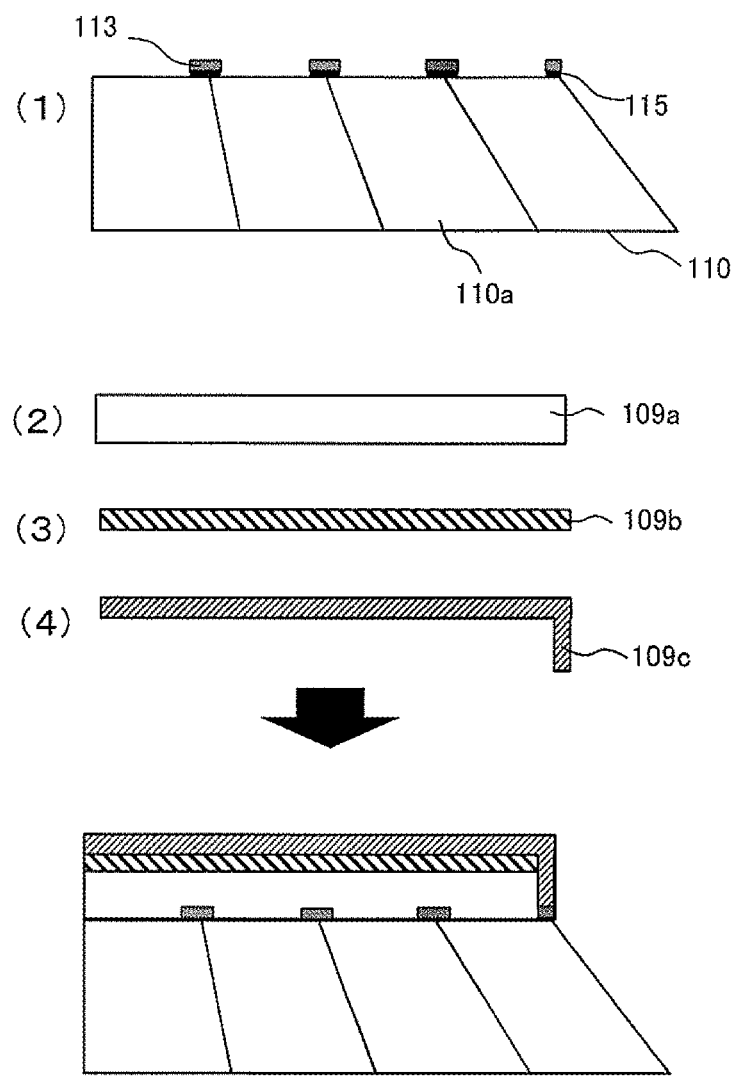
[FIG. 3H]

[FIG. 3I]
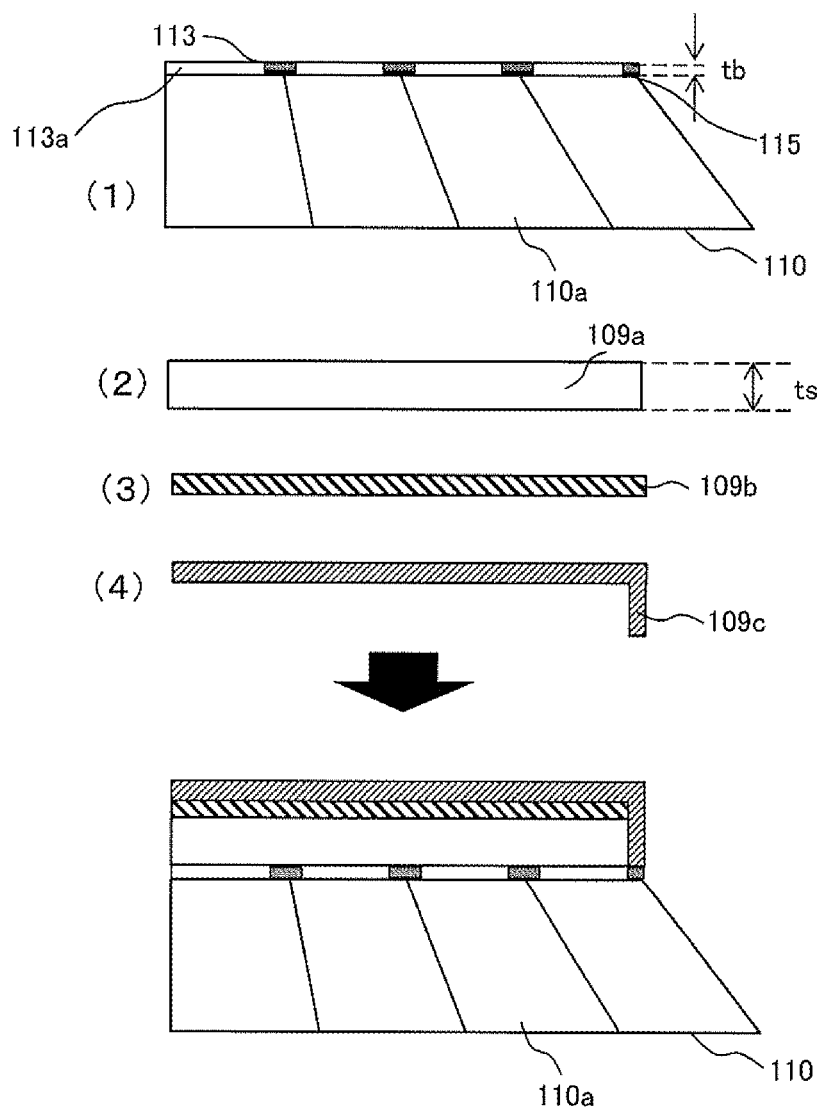

[FIG. 3J]
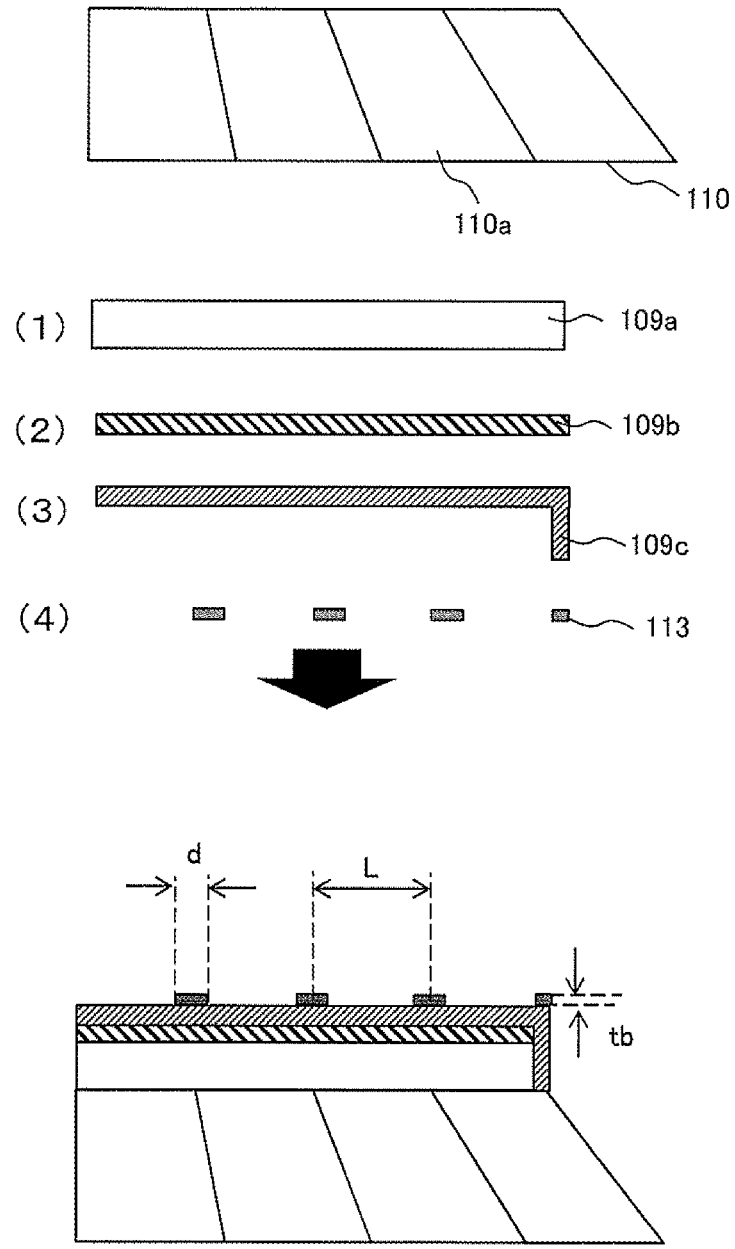

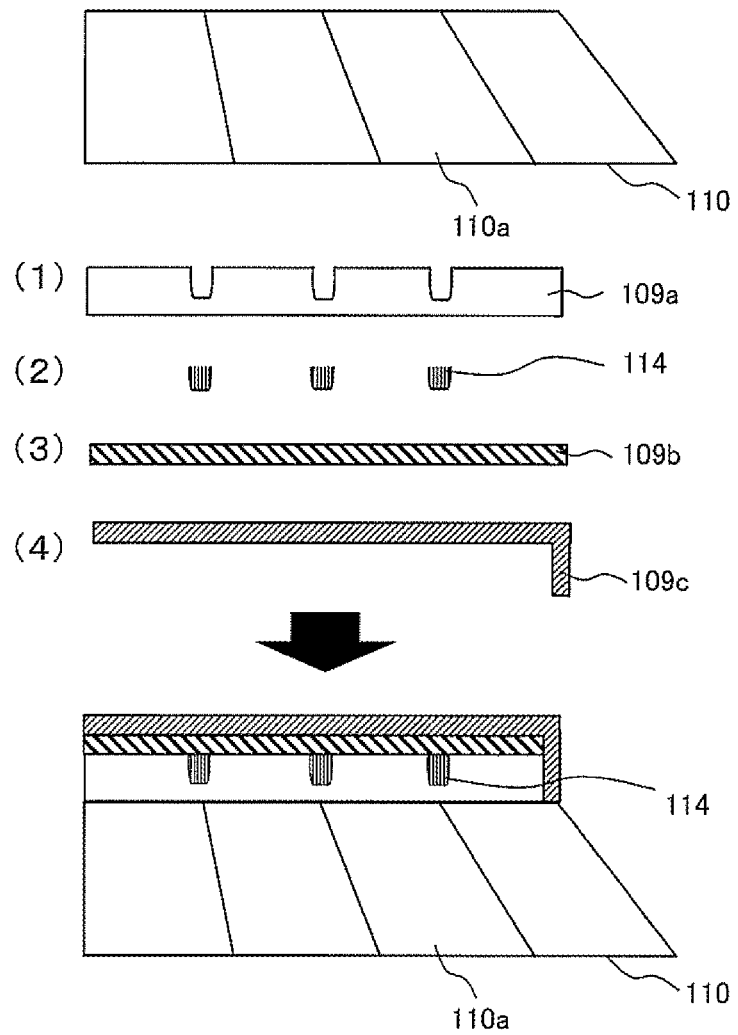
[FIG. 3K]

[FIG. 4]
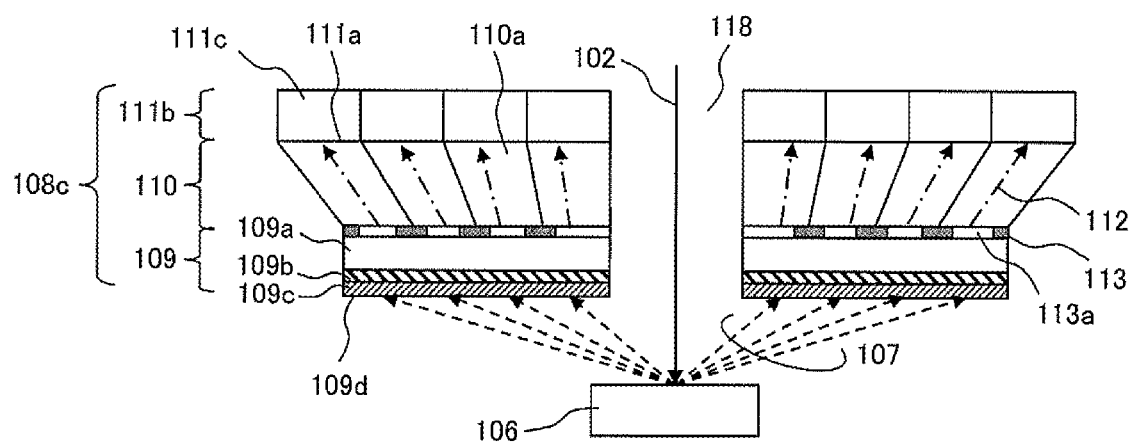
[FIG. 5]
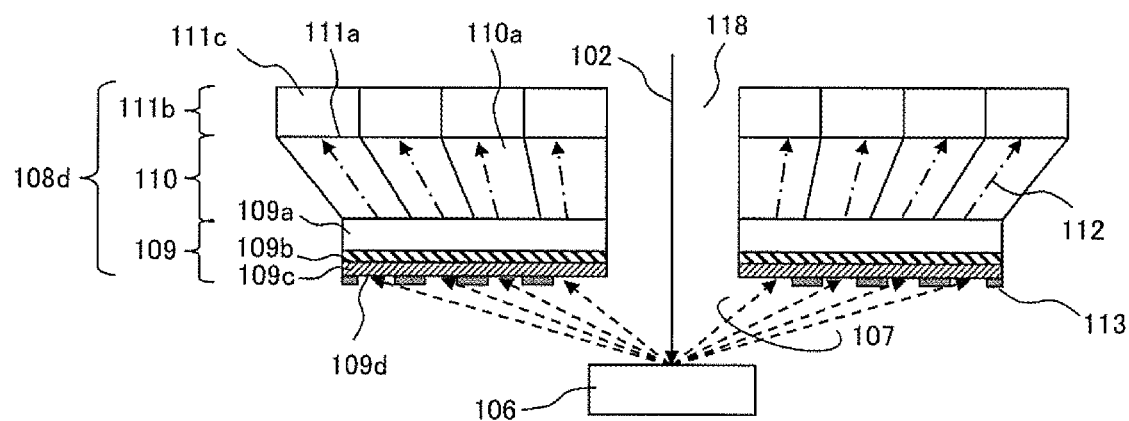

[FIG. 6]
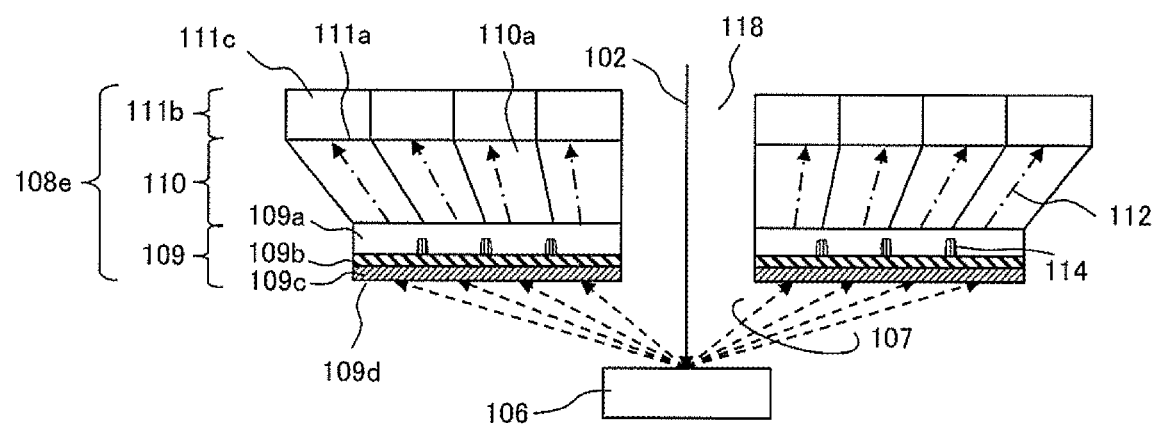
[FIG. 7]
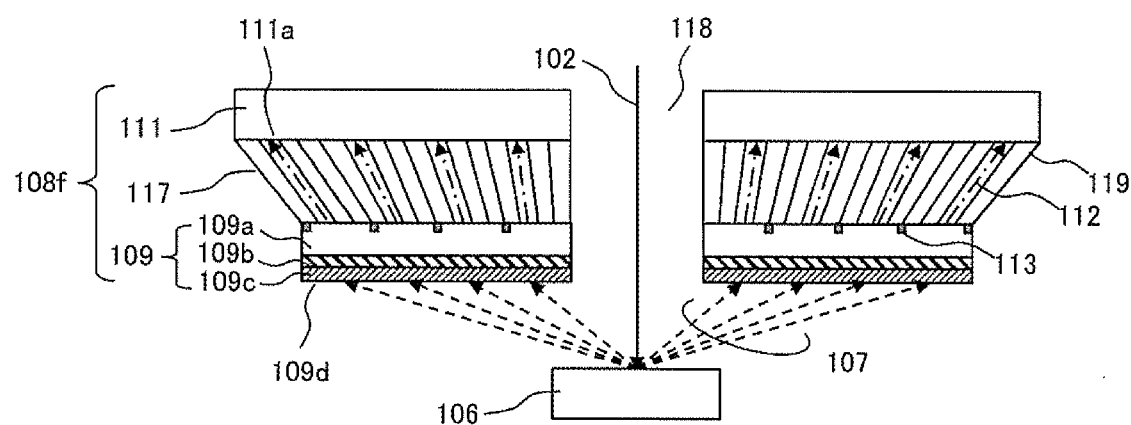

[FIG. 8]
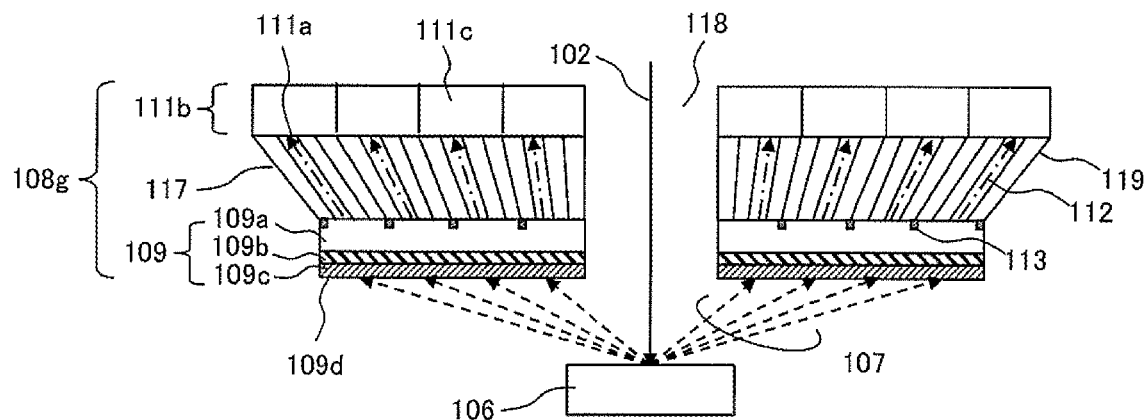
[FIG. 9]
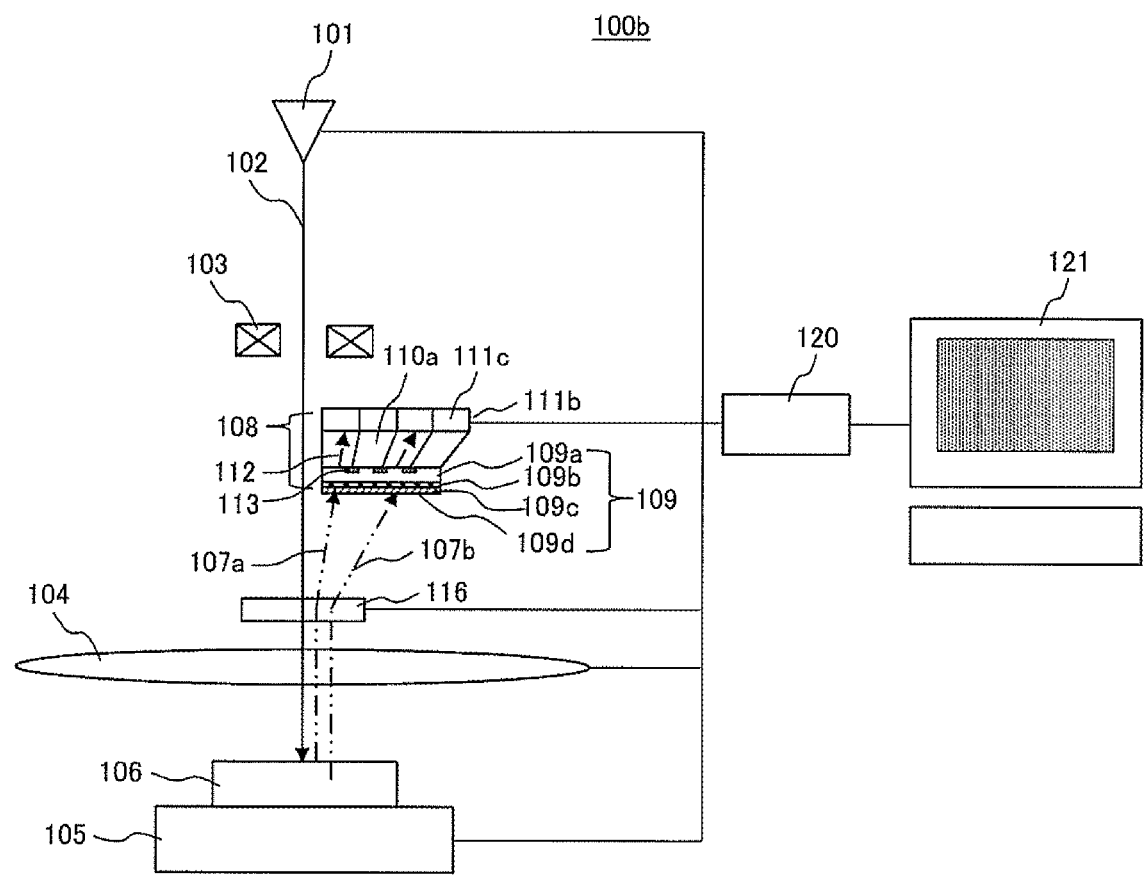

[FIG. 10]
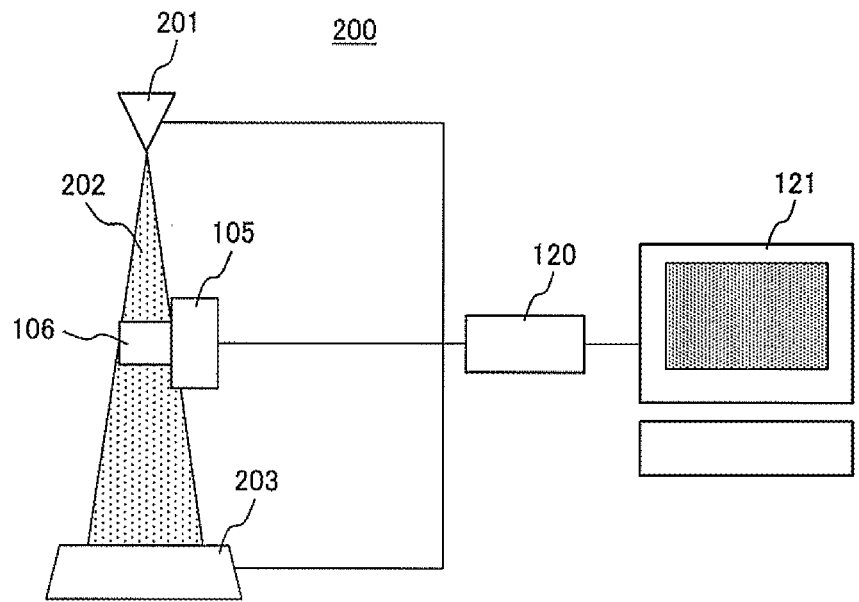
[FIG. 11]
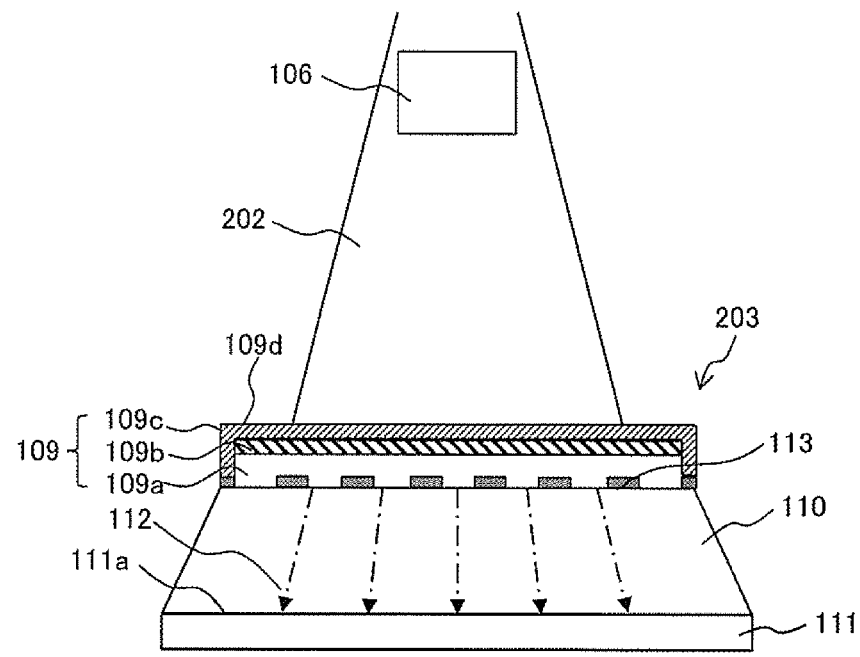

DEVICE FOR DETECTING CHARGED PARTICLES OR RADIATION

TECHNICAL FIELD

The present invention relates to a detection device that detects charged particles or radiation as detection targets.

BACKGROUND ART

Detection devices are used to convert particle signals, such as electrons and ions, or radiation signals, such as X-rays and gamma rays, into voltage signals, current signals, or the like. In a case where the detection target is charged particles, the detection device is called a charged particle detection device, and in a case where the detection target is radiation, the detection device is called a radiation detection device.

For example, a scanning electron microscope (SEM) is a charged particle device that utilizes charged particle beams such as electron beams. In such a charged particle device, the target to be detected is charged particles such as electrons, and a charged particle detection device is essential.

The SEM irradiates a sample to be observed with an electron beam generated by an electron source, and accordingly, the electrons emitted from the sample are detected by a charged particle detection device. A charged particle detection device outputs a current corresponding to the amount of detected electrons. An SEM image is formed by two-dimensionally displaying the relationship between the current amount and the electron beam irradiation position on the sample.

Many of these charged particle detection devices include a scintillator that converts the detected electrons into photons, a light guide that delivers the light emitted by the scintillator to a light detector, and the light detector that detects the photons from the scintillator and converts the photons into the current. A photomultiplier tube (PMT), multi-pixel photon counter (MPPC), or the like is used as the light detector.

Moreover, the radiation detection device has the same configuration but differs only in the type of scintillator. That is, in a radiation detection device, a scintillator converts detected radiation into light of a wavelength detectable by a light detector.

JP-A-2014-32029 (PTL 1) discloses, as an example of a scintillator, a technology for increasing the output of emitted light.

CITATION LIST

Patent Literature

PTL 1: JP-A-2014-32029

SUMMARY OF INVENTION

Technical Problem

However, the technology of the related art has a problem that crosstalk may occur in the detection device.

Crosstalk refers to a phenomenon in which the positions where charged particles or radiation, which are detection targets, are incident on a scintillator do not correspond exactly to the positions where light is incident on a light detector.

For example, it is assumed that a specific pixel in the microscope image corresponds to a specific region of the scintillator and a specific region of the light detector. In a case where charged particles are incident on only one region of a scintillator, the range of light spreads as the light propagates in the scintillator or light guide, and the light detector may detect the light in a plurality of regions. This is an example of crosstalk.

When crosstalk occurs, for example, the accuracy of the microscope image deteriorates.

The present invention has been made to solve such problems, and an object thereof is to reduce crosstalk in a detection device that detects charged particles or radiation as detection targets.

Solution to Problem

According to an example of the present invention, there is provided a detection device that detects charged particles or radiation as detection targets, including: a scintillator including a fluorescent layer that converts the detection target into light; a light detector that detects light emitted from the scintillator; a light guide provided between the scintillator and the light detector; and a shielding unit that partially shields at least one of the detection target incident on the scintillator and the light emitted from the scintillator.

Advantageous Effects of Invention

The detection device according to the present invention can reduce crosstalk.

BRIEF DESCRIPTION OF DRAWINGS

FIG. 1 is a schematic diagram of a charged particle beam device according to Example 1.

FIG. 2A is a schematic diagram of a charged particle detection device of FIG. 1.

FIG. 2B is a diagram schematically showing a relationship between a thickness and light transmittance of a shielding unit.

FIG. 3A is a schematic diagram of a charged particle detection device according to Example 2.

FIG. 3B is a schematic diagram of a light detector of the charged particle detection device of FIG. 3A.

FIG. 3C is a schematic diagram of the shielding unit of the charged particle detection device of FIG. 3A.

FIG. 3D is a schematic diagram of a modification example of the shielding unit.

FIG. 3E is a diagram for explaining dimensions of the shielding unit.

FIG. 3F is a diagram schematically showing a relationship between a shielding width of the shielding unit and a crosstalk amount.

FIG. 3G is a diagram schematically showing a relationship between the shielding width of the shielding unit and an output efficiency of light emission.

FIG. 3H is a view for explaining an example of a method for manufacturing the charged particle detection device according to Example 2.

FIG. 3I is a view for explaining an example of a method for manufacturing the charged particle detection device according to Example 2.

FIG. 3J is a view for explaining an example of a method for manufacturing the charged particle detection device according to Example 2.

FIG. 3K is a view for explaining an example of a method for manufacturing the charged particle detection device according to Example 2.

FIG. 4 is a schematic diagram of a charged particle detection device according to Example 3.

FIG. 5 is a schematic diagram of a charged particle detection device according to Example 4.

FIG. 6 is a schematic diagram of a charged particle detection device according to Example 5.

FIG. 7 is a schematic diagram of a charged particle detection device according to Example 6.

FIG. 8 is a schematic diagram of a charged particle detection device according to Example 7.

FIG. 9 is a schematic diagram of a charged particle beam device according to Example 8.

FIG. 10 is a schematic diagram of a radiation device according to Example 9.

FIG. 11 is a schematic diagram of a radiation detection device of FIG. 10.

DESCRIPTION OF EMBODIMENTS

Hereinafter, examples of the present invention will be described with reference to the drawings. In addition, in all the drawings for describing the examples, the same elements may be denoted by the same reference numerals, and the repeated description thereof may be omitted.

A charged particle detection device that detects charged particles as detection targets will be described below as an example. However, by appropriately changing the configuration related to the scintillator (such as the type of scintillator), it is possible to similarly configure a radiation detection device that detects radiation as a detection target.

The charged particles are electrons in the examples below, but may also be positrons, protons, alpha rays, other ions, and the like. Also, radiation includes electromagnetic waves (including X-rays, gamma rays, and the like), neutron rays, muons, and the like.

Example 1

FIG. 1 is a schematic diagram of a charged particle beam device 100a according to Example 1 of the present invention. In Example 1, the charged particle beam device is configured as an SEM. Primary electrons 102 are extracted from an electron source 101. The charged particle beam device 100a has a scanning deflector 103 and an objective lens 104. The scanning deflector 103 and the objective lens 104 are arranged on the trajectory of the primary electrons 102.

The primary electrons 102 irradiate a sample 106 arranged on a sample transport stage 105. Signal electrons 107 are emitted from the sample 106. Here, the signal electrons 107 mean electrons emitted from the sample, including secondary electrons that are directly excited by the primary electrons and emitted into the vacuum, and backscattered electrons in which the primary electrons are repeatedly scattered in the sample and emitted again into the vacuum.

Under the objective lens 104, a charged particle detection device 108a for detecting signal electrons is provided. A central opening portion 118 is provided in the center of the charged particle detection device 108a such that the primary electrons 102 pass therethrough. The primary electrons 102 emitted from the electron source 101 are controlled by the objective lens 104 and focused on the sample 106 to minimize the beam diameter.

The scanning deflector 103 is controlled by a system control unit 120 and deflects the primary electrons 102 such that the primary electrons 102 scan a defined region of the sample 106. The signal electrons 107 are detected by the charged particle detection device 108a. An SEM image is formed on a monitor 121 by performing signal processing on the detected signal electrons 107 in synchronization with the scanning signal sent from the system control unit 120 to the scanning deflector 103.

FIG. 2 is a schematic diagram of the charged particle detection device 108a of FIG. 1. The charged particle detection device 108a has the following configuration:

a scintillator 109 having a fluorescent layer 109a that converts the signal electrons 107, which are detection targets, into light 112;

a light detector 111 for detecting the light 112 emitted from the scintillator 109; and a light guide 110 provided between the scintillator 109 and the light detector 111.

The scintillator 109 includes the fluorescent layer 109a, a collodion layer 109b, and a reflection layer 109c. A shielding unit 113 is provided in contact with the scintillator 109 (embedded in the scintillator 109 in the example of FIG. 2). The shielding unit 113 may be configured as a layer (shielding layer). Alternatively, the shielding unit 113 may be configured as a black matrix.

The scintillator 109 has a surface on which the signal electrons 107 are incident (incident surface 109d) and a surface from which light is emitted (emission surface). The emission surface of the scintillator 109 comes into contact with the incident surface of the light guide 110.

In the present example, the shielding unit 113 is arranged between the scintillator 109 and the light guide 110. In particular, the shielding unit 113 is provided on the emission surface of the scintillator 109 (that is, the surface of the fluorescent layer 109a that comes into contact with the light guide 110). According to such a configuration, it is possible to efficiently shield light caused by fluorescence.

When the shielding unit 113 is made of, for example, metal or resin, manufacturing is easy, and the transmittance can be lowered.

The shielding unit 113 can be made of a reflective or absorptive material. As examples of reflective or absorbing materials, at least one of titania, zirconia, alumina, ceria, tin oxide, zircon, iron oxide, zinc oxide, niobium oxide, silicon nitride, boron nitride, aluminum nitrate, silicon carbide, aluminum hydroxide, barium titanate, and diamond can be used. The use of such materials facilitates manufacturing and can reduce transmittance.

The shielding unit 113 can be configured to include a light reflection layer, and for example, the entire shielding unit 113 can be configured with the light reflection layer. With such a configuration, it is possible to reduce the light transmittance. When the light reflection layer is made of aluminum, the light reflection layer is lightweight and easy to manufacture.

In addition, the shielding unit 113 can be formed using, for example, a metal thin film of chromium. Moreover, the shielding unit 113 can be formed using an alloy, for example. The alloy can be made of two or more of carbon, manganese, silicon, phosphorous, sulfur, aluminum, yttrium, nickel, and iron. Alternatively, the shielding unit 113 may be formed using a polymer. Metal particles may also be mixed in the polymer. Metal particles are for example aluminum, zinc, copper, iron, silver, gold, or nickel. The metal particles may be arranged at different positions in the polymer. Further, alternatively, the shielding unit 113 may be formed using a metal thin film. Metal thin films can be made of, for example, chromium, aluminum, gold, silver, tungsten, and the like. Alternatively, the shielding unit 113 can be formed using a photosensitive resin containing carbon black. Alternatively, the shielding unit 113 can be formed using an organic material (for example, organic resin).

The shielding unit 113 partially shields at least one of the signal electrons 107 incident on the scintillator 109 and the light 112 emitted from the scintillator 109. In the present example, the shielding unit 113 shields part of the light 112, but in another embodiment which will be described later, the shielding unit 113 shields a part of the signal electrons 107. Both of these may be shielded.

In the present example, the fluorescent layer 109a is formed using an inorganic powder fluorescent material. The median diameter of the powder fluorescent material is, for example, within the range of 1 μm to 50 μm. A good fluorescent thin film can be formed from the powder fluorescent material having a diameter within this range. In particular, good resolution can be realized by using a powder fluorescent material with a diameter of 10 μm or less. The powder fluorescent material includes, for example, any of the following:

P47 ($Y_2SiO_5$:Ce);
YAG or GGAG (($Y, Gd)_3(Al, Ga)_5O_{12}$:Ce, $(Y, Gd)_3(Al, Ga)_5O_{12}$:Tb);
YAP ($YAlO_3$:Ce); and
GOS ($Gd_2O_2S$:Pr, $Gd_2O_2S$:Ce, $Gd_2O_2S$:Tb).

By using such a powder fluorescent material, the fluorescent layer 109a having an appropriate emission intensity can be configured according to the dimensions (for example, thickness) of the scintillator 109.

The powder fluorescent material can be formed using a sedimentation coating method, a centrifugal coating method, a printing method, or the like.

One surface of the fluorescent layer 109a (the surface that forms the emission surface of the scintillator 109) is arranged to be in contact with the incident surface of the light guide 110. A thin film of the collodion layer 109b is formed in contact with the other surface of the fluorescent layer 109a, and a thin film of the reflection layer 109c is formed thereon. The reflection layer 109c reflects light and increases the proportion of photons generated in the fluorescent layer 109a, which are incident on the light guide 110.

The collodion layer 109b is, for example, a resin layer. By providing the collodion layer 109b, the unevenness of the fluorescent layer 109a can be smoothed or flattened. The resin layer may contain nitrocellulose. With such a configuration, the resin layer can be formed thin. Nitrocellulose may be contained in an appropriate solvent (for example, ethyl acetate).

The reflection layer 109c is made of, for example, aluminum and has a thickness of, for example, 700 to 1000 angstroms. The reflection layer 109c can be deposited by evaporating pure aluminum onto the collodion film.

When the signal electrons 107 are converted into photons within the scintillator 109, scattering occurs within the fluorescent layer 109a. Therefore, the positions where the signal electrons 107 are incident on the scintillator 109 do not correspond exactly to the positions where the light is incident on the light detector 111. In the configuration of the related art, this causes crosstalk.

On the other hand, in the charged particle detection device 108a according to Example 1, the shielding unit 113 reduces crosstalk. That is, the shielding unit 113 divides the regions from which light can be emitted from the scintillator 109 and separates these regions from each other. Therefore, the light generated by the signal electrons 107 incident on one region and the light generated by the signal electrons 107 incident on another region are not incident on the same position on the light detector 111. Accordingly, crosstalk is reduced.

The shielding unit 113 may be arranged at a part where crosstalk is desired to be reduced, and any specific shape can be designed. When the plurality of regions from which light can be emitted: from the scintillator 109 are completely separated from each other, crosstalk between the regions can be further reduced, but it is not necessary to have such a configuration (that is, the plurality of regions may be partially contiguous with each other).

The light transmittance of the shielding unit 113 can be appropriately designed by those skilled in the art, but when the light transmittance is set to be equal to or less than 60%, crosstalk can be appropriately reduced. As shown in FIG. 2B, for example, by using a chromium thin film with a thickness of 10 nm or more, the light transmittance of the shielding unit 113 can be set to be equal to or less than 60%. Accordingly, crosstalk is reduced.

The light guide 110 has a surface on which the light emitted from the scintillator 109 is incident (incident surface), and a surface from which the light is emitted (emission surface). As shown in FIG. 2, the area of the emission surface of the light guide 110 is greater than the area of the incident surface of the light guide 110. Therefore, the optical path is expanded by the light guide 110.

Here, saturation of a light detector that occurs in an SEM or the like of the related art will be described. In SEMs and the like, there is a demand to increase the current of the primary electron beam in order to improve the resolution. As the current increases, the number of photons, which are incident on the light detector, from the scintillator also increases. However, when the incident photon density with respect to the area of the detection surface increases, the light detector saturates and cannot accurately count the number of incident photons.

For example, in an MPPC (for example, model: S13360-6025CS manufactured by Hamamatsu Photonics K.K.), a square detection surface with a side of several mm is covered with fine square detection pixels with a side of several tens of μm. When a photon is incident on each detection pixel, an electrical signal is generated for each pixel, and electrical signals of each pixel represent the detection of one photon. Here, when the incident photon density increases and a plurality of photons are simultaneously incident on one detection pixel, the proportional relationship between the number of incident photons and the output current collapses, and it becomes impossible to obtain an accurate photographed image. That is, in a case where the current of the primary electron beam becomes large, the light detector may be saturated.

As described above, in general, when the incident photon density increases in a light detector, the proportional relationship between the amount of incident photons and the output current collapses, and the number of incident photons cannot be accurately counted. In this case, an accurate photographed image cannot be obtained. For example, when the current of the primary electron beam increases, the number of photons incident on the incident surface (detection surface 111a) of the light detector 111 especially at a position near the central opening portion 118 increases, and the signal intensity corresponding to the primary electrons 102 incident near the central opening portion 118 saturates.

On the other hand, in the charged particle detection device 108a according to Example 1, the light guide 110 expands the optical path, and thus the light emitted from the scintillator 109 is dispersed and the density of photons incident on the light detector 111 is reduced. Therefore, even when the current of the primary electron beam increases, the light detector 111 does not saturate, and a photographed image with more accurate contrast can be obtained.

Further, the resolution of a general scintillator is less than 1 mm, but the resolution of a general light detector is at least approximately 1 mm, and the resolution of the scintillator cannot be effectively used in a case where these are simply connected. On the other hand, in the charged particle detection device 108a according to Example 1, the light from the scintillator 109 can be expanded by the light guide 110 and made incident on the light detector 111, and thus the high resolution of the scintillator 109 can be effectively used.

Further, in the present example, the area ratio between the incident surface of the scintillator 109 and the incident surface of the light detector 111 is equal to the area ratio between the incident surface of the light guide 110 and the emission surface of the light guide 110. In particular, the area of the incident surface of the scintillator 109 and the area of the incident surface of the light guide 110 are equal to each other, and the area of the incident surface of the light detector 111 and the area of the emission surface of the light guide 110 are equal to each other. According to such a configuration, it is possible to efficiently utilize the space by matching the dimensions of each component.

The area of the incident surface of the light detector 111 is preferably equal to or less than 20 times the area of the incident surface of the scintillator 109. When the area exceeds 20 times, the manufacturing process becomes complicated and the efficiency deteriorates.

In order to obtain as many signal electrons 107 as possible, it is desirable to make the central opening portion 118 as small as possible without interfering with the trajectory of the primary electrons 102. Therefore, as shown in FIG. 2, it is desirable to expand the detection surface 111a of the light detector outward in the radial direction from the incident surface 109d of the scintillator, rather than inward in the radial direction (toward the central opening portion 118). According to such a configuration, many signal electrons 107 can be detected.

Furthermore, the inventors have found that the transmittance of the light guide 110 (ratio of light emitted from one surface to light incident from the other surface) varies depending on the light propagation direction. In particular, the transmittance is higher in a case where light propagates from a surface with a smaller area to a surface with a greater area (corresponding to the present example) than vice versa. Therefore, in a case where the area of the emission surface is greater than that of the incident surface as in this configuration, not only can the saturation of the light detector 111 be avoided, but also the transmittance is increased.

In FIG. 2, the light guide 110 has a shape in which the cross-sectional area monotonously increases from the incident surface to the emission surface, but the shape of the light guide 110 is not limited to this. For example, the shape may be such that the cross-sectional area decreases up to a certain position from the incident surface toward the emission surface, and the cross-sectional area increases beyond that position.

Example 2

FIG. 3A is a schematic diagram of a charged particle detection device 108b according to Example 2. FIG. 3B is a schematic diagram of the light detector 111b of the charged particle detection device 108b of FIG. 3A, and is a diagram of the incident surface viewed from the sample side in the optical axis direction.

The charged particle detection device 108b of the present example uses an array-like light detector 111b composed of a plurality of detection cells 111c instead of the light detector 111 of Example 1.

In addition, in Example 2, the light guide 110 is composed of a plurality of divided blocks 110a. The divided blocks 110a are manufactured as separate members and arranged to form the light guide 110. Therefore, a discontinuous surface exists at the boundary of each divided block 110a, and propagation of light beyond the divided block 110a is suppressed. Accordingly, crosstalk is further reduced.

As shown in FIG. 3B, in the present example, as an example, eight array-like light detectors 111b (for example, model: S13615-1025N-04 manufactured by Hamamatsu Photonics K.K.) are arranged to form a light detector. The light detectors 111b each include 16 (4×4) channels of detection cells 111c. As a modification example, the light detector 111b may be an array-like light detector (for example, model: S13615-1025N-08 manufactured by Hamamatsu Photonics K.K.) composed of 64 (8×8) channels of detection cells.

The divided blocks 110a of the light guide 110 are in one-to-one correspondence with the detection cells 111c of the array-like light detector. As a result, almost all photons incident on a certain divided block 110a are incident on the detection cell 111c corresponding to the divided block 110a, and crosstalk is further reduced.

The signal electrons 107 incident on the incident surface 109d of the scintillator 109 are converted into photons. The photons are incident on the divided block 110a immediately above the incident position of the scintillator 109, and are guided through the divided block 110a. After that, the photons are incident on the detection cell 111c of the light detector 111b corresponding to the divided block 110a.

The distance in the radial direction from the position where the primary electrons 102 are incident on the sample 106 to the position where the signal electrons 107 are incident on the incident surface 109d of the scintillator is set to w. The distance in the axial direction from the surface of the sample 106 to the incident surface 109d of the scintillator is set to h. The emission angle of the signal electrons 107 from the sample is set to a. In a case where the light detector 111b detects the signal electrons 107, w can be calculated or estimated from the position of the detection cell 111c. In addition, since h is a known value, the emission angle α of the signal electrons 107 can be calculated from w and h.

Since the direction in which the signal electrons are emitted differs depending on the material and shape of the sample, information on the material and shape of the sample can be obtained by detecting the emission angle α of the signal electrons 107 from the sample.

In this manner, a detection device capable of detecting the incident position of the signal electrons 107 with high accuracy is particularly referred to as a position discrimination detection device in the present specification. The charged particle detection device 108b according to Example 2 is an example of a position discrimination detection device. In addition, although the incident position of the signal electrons 107 can also be specified to some extent with the charged particle detection device 108a according to Example 1, the position detection accuracy is higher with the position discrimination detection device.

The charged particle detection device 108b according to the present example has the above-described configuration, and accordingly, the incident position of the signal electrons on the detection surface can be discriminated with high accuracy. By discriminating the incident position with high accuracy, the emission angle of the signal electrons from the sample can be calculated, and detailed information regarding the material and shape of the sample can be obtained.

FIG. 3C is a schematic diagram of the shielding unit 113 of the charged particle detection device 108b of FIG. 3A, and is a diagram viewed from the sample side in the optical axis direction. The shielding unit 113 is configured to divide the incident surface, cross section, or emission surface (the emission surface in the present example) of the scintillator 109 into a plurality of open regions 113c.

In the example of FIG. 3C, the open regions 113c are square and arranged in a two-dimensional array shape except for the range corresponding to the central opening portion 118. Such a configuration is preferable for specifying the incident positions of the signal electrons 107 in a two-dimensional array shape.

The open regions 113c are separated from each other by the shielding units 113, and the light generated by the signal electrons 107 incident on one open region 113c and the light generated by the signal electrons 107 incident on another open region 113c are not incident on the same position on the light detector 111. Accordingly, crosstalk is reduced.

The open region 113c of the shielding unit 113, the divided block 110a of the light guide 110, and the detection cell 111c of the light detector 111b are arranged to correspond to each other. Therefore, almost all of the light that has passed through a certain open region 113c propagates through the divided block 110a corresponding to that open region 113c, and almost all of the light is incident on the detection cell 111c that corresponds to that open region 113c. Accordingly, crosstalk is reduced.

FIG. 3D is a schematic diagram of a modification example of the shielding unit 113. A plurality of open regions 113c are arranged in the radial direction and in the circumferential direction. Such a configuration is preferable for specifying the incident position of the signal electrons 107 in the radial direction and in the circumferential direction. It is preferable to change the configuration of the scintillator 109, the configuration of the divided blocks 110a of the light guide 110, and the configuration of the light detector 111b, according to the configuration of the shielding unit 113.

The dimensions of the shielding unit 113 will be described with reference to FIG. 3E. A shielding width d of the shielding unit 113 is, for example, within a range of 1 µm to 1 mm. Further, when the relationship between the shielding width d and the pitch L satisfies 0.002 L≤d≤0.6 L, it is preferable that the output efficiency of light emission exceed 168. The shielding width is the width of the line when the shielding unit 113 is linearly formed as shown in FIG. 3C or 3D, for example.

The pitch L of the shielding units 113 can be set to 2 mm, for example. When the pitch L is equal to or less than 2 mm, the resolution of the charged particle detection device 108b may be sufficient. Further, when the pitch L is equal to or less than 0.5 mm, the resolution of the charged particle detection device 108b may be further improved. In addition, the definition of the pitch L is obvious in a case where the shielding units 113 are formed by parallel lines at equal intervals, but even in a case where the shielding units 113 are not formed in such a manner, the method of measuring the pitch L of the shielding units 113 can be appropriately defined. For example, the pitch L can be defined based on the maximum opening diameter of each open region 113c.

A thickness tb of the shielding unit 113 can be equal to or less than half a thickness ts of the fluorescent layer 109a. Such a configuration is preferable in a case where the shielding unit 113 is embedded in the fluorescent layer 109a as shown in FIG. 3E. With such a configuration, the charged particle detection device 108b can be easily manufactured, and the light transmittance can be increased.

FIG. 3F schematically shows the relationship between the shielding width d of the shielding unit 113 and the crosstalk amount. In this example, chromium is used for the shielding unit 113, the thickness tb is set to 100 nm, and the pitch L is set to 0.5 mm. In addition, a thin film made of P47 and having the thickness ts of 10 µm or less was used for the fluorescent layer 109a. According to FIG. 3F, under this condition, even when the shielding width d is reduced to 1 µm (0.002 L), crosstalk can be suppressed to less than 4% by using the shielding unit 113. As the shielding width d increases, the crosstalk amount decreases. The crosstalk decreases to 0% when the shielding width d is equal to or greater than 200 µm, and then the crosstalk remains 0% even when the shielding width d reaches 300 µm (0.6 L).

FIG. 3G schematically shows the relationship between the shielding width d of the shielding unit 113 and the output efficiency of light emission. In this example, similarly to FIG. 3F, chromium is used for the shielding unit 113, the thickness tb is set to 100 nm, and the pitch L is set to 0.5 mm. In addition, a thin film made of P47 and having the thickness ts of 10 µm or less was used for the fluorescent layer 109a. The output efficiency decreases as the shielding width d increases. Furthermore, even when the shielding width d reaches 300 µm (0.6 L), the light output efficiency of 16% or more is maintained.

In this manner, the appropriate shielding width d can be determined in consideration of the crosstalk amount and the output efficiency. For example, an appropriate shielding width d can be determined based on the pitch L, the thickness ts of the fluorescent layer 109a, the upper limit of the crosstalk amount, and the lower limit of the output efficiency of light emission. For example, in a case where the thickness ts of the fluorescent layer 109a is 200 µm, the upper limit of the crosstalk amount to be achieved is 4%, and the lower limit of the output efficiency of light emission to be achieved is 16%, the shielding width d of the shielding unit 113 and the pitch L can be adjusted to each other as parameters as described above.

Next, an example of a method for manufacturing the charged particle detection device 108b according to Example 2 will be described with reference to FIGS. 3H to 3K. These manufacturing methods are also applicable to Example 1 except for the structure of the light guide 110.

In the example of FIG. 3H, the divided blocks 110a are arranged in a first step. Next, the shielding unit 113 is arranged at a position corresponding to the joint part of the divided block 110a. The shielding unit 113 is fixed to the divided block 110a via a resin 115, for example. The position of the shielding unit 113 corresponds to the boundary and outer edge of the divided block 110a.

In a second step, the fluorescent layer 109a is formed using a sedimentation coating method, a centrifugal coating method, or the like. The collodion layer 109b is formed in a third step, and the reflection layer 109c is formed in a fourth step.

The example of FIG. 3I is preferable in a case where the thickness tb of the shielding unit 113 is equal to or greater than half the thickness ts of the fluorescent layer 109a. In the example of FIG. 3I, flat medium units 113a are formed between the shielding units 113 to allow light to pass therethrough. The flat medium unit 113a has a flat structure and is made of glass, plastic material, or the like. In a case where the resin 115 has a thickness that cannot be ignored with respect to the shielding unit 113, the flat medium unit 113a is formed between the resins 115 as well.

In this manner, the shielding unit 113 and the flat medium unit 113a form a partial shielding layer that partially shields light. The partial shielding layer is arranged between the scintillator and the light guide to shield a part of the light and allow a part of the light to pass therethrough. According to such a configuration, the flat medium unit 113a reinforces the shielding unit 113 and the periphery thereof, thereby improving the intensity of the whole.

The method for manufacturing the charged particle detection device shown in FIG. 3I is such that the flat medium unit 113a is further formed in the first step in the method shown in FIG. 3H. The second and subsequent steps can be the same as the example of FIG. 3H.

In the example of FIG. 3J, the shielding unit 113 is provided on the incident side with respect to the scintillator 109. In particular, the shielding unit 113 is formed on the reflection layer 109c. The shape of the shielding unit 113 (shielding width d, pitch L, thickness tb, and the like) can be the same as shown in FIG. 3E.

In the example of FIG. 3J, in the first step, the divided blocks 110a are arranged, and the fluorescent layer 109a is formed using a sedimentation coating method, a centrifugal coating method, or the like. The collodion layer 109b is formed in the second step, and the reflection layer 109c is formed in the third step. In the fourth step, the shielding unit 113 is formed on the reflection layer 109c via a resin or an adhesive. The position of the shielding unit 113 corresponds to the boundary of the divided block 110a.

In the example of FIG. 3K, the shielding unit 114 is provided inside the scintillator 109 and divides the cross section of the scintillator 109 into a plurality of open regions. Here, the cross section means, for example, a cross section along a plane perpendicular to the optical axis. In particular, in the example of FIG. 3K, the shielding unit 114 is provided on the emission surface of the fluorescent layer 109a.

In the example of FIG. 3K, in the first step, the divided blocks 110a are arranged, and the fluorescent layer 109a is formed using a sedimentation coating method, a centrifugal coating method, or the like. The fluorescent layer 109a is provided with grooves for forming the shielding units 114. The positions of the grooves correspond to the boundary of the divided block 110a.

In the second step, reflective particles are inserted into the grooves of the fluorescent layer 109a to form the shielding units 114. As the shielding unit 114, at least one of titania, zirconia, alumina, ceria, tin oxide, zircon, iron oxide, zinc oxide, niobium oxide, silicon nitride, boron nitride, aluminum nitrate, silicon carbide, aluminum hydroxide, barium titanate, and diamond can be used. The collodion layer 109b is formed in a third step, and the reflection layer 109c is formed in a fourth step.

Example 3

FIG. 4 is a schematic diagram of a charged particle detection device 108c according to Example 3. This charged particle detection device 108c can be manufactured by the method shown in FIG. 3I in Example 2.

Similarly to the charged particle detection device 108a according to Example 1, the charged particle detection device 108c in FIG. 4 can reduce crosstalk and avoid saturation.

Example 4

FIG. 5 is a schematic diagram of a charged particle detection device 108d according to Example 4. This charged particle detection device 108d can be manufactured by the method shown in FIG. 3J in Example 2.

Similarly to the charged particle detection device 108a according to Example 1, the charged particle detection device 108d in FIG. 5 can reduce crosstalk and avoid saturation.

Example 5

FIG. 6 is a schematic diagram of a charged particle detection device 108e according to Example 5. This charged particle detection device 108e can be manufactured by the method shown in FIG. 3K in Example 2.

Similarly to the charged particle detection device 108a according to Example 1, the charged particle detection device 108e in FIG. 6 can reduce crosstalk and avoid saturation.

Example 6

FIG. 7 is a schematic diagram of a charged particle detection device 108f according to Example 6. In the charged particle detection device 108f of the present example, the configuration of the light guide is changed in the structure of the charged particle detection device 108a according to Example 1.

In the charged particle detection device 108f according to Example 6, the light guide 117 has a fiber optic plate (FOP) 119. The FOP 119 is an optical component in which fine optical fibers with a diameter of several μm are bundled (for example, model: J5734 manufactured by Hamamatsu Photonics K.K.). The FOP 119 has a tapered shape, for example.

Photons which are incident on a fiber on the incident surface of the FOP 119 are emitted from the same fiber on the emission surface without penetrating an adjacent fiber. Therefore, the photons can be transmitted to the emission surface while preserving the incident position of the photons on the incident surface.

In the charged particle detection device 108f of the present example, the FOP 119 has a tapered shape, and the area of the emission surface and the fiber diameter are greater than the incident surface, but the present example is the same as Example 1 in that the photons can be transmitted while preserving the incident position information of photons on the incident surface.

The incident positions of photons on the scintillator 109 are biased, and most of the signal electrons are incident on positions close to the trajectory of the primary electrons 102 (for example, within a range of several mm from the central opening portion 118). In the charged particle detection device 108f of the present example, the photons incident with high density are dispersed by the fine optical fibers of the tapered FOP 119, and thus the light detector 111 can be prevented from being saturated.

As described above, the charged particle detection device of the present example has a structure in which the optical path is expanded by the tapered FOP 119. Therefore, even when the current of the primary electron beam increases, the light detector 111 does not saturate, and the photographed image with accurate contrast can be obtained.

Further, the inventors have found that the transmittance of the tapered FOP 119 (ratio of light emitted from one surface to light incident from the other surface) varies depending on the light propagation direction. In particular, the transmittance is higher in a case where light propagates from a surface with a smaller area to a surface with a greater area (corresponding to the present example) than vice versa. Therefore, in a case where the area of the emission surface is greater than that of the incident surface as in this configuration, not only can the saturation of the light detector 111 be avoided, but also the transmittance is increased.

Example 7

FIG. 8 is a schematic diagram of a charged particle detection device 108g according to Example 7. The charged particle detection device 108g of the present example uses the light detector 111b composed of a plurality of detection cells 111c similar to Example 2 instead of the light detector 111 of Examples 1 and 6. Further, similarly to Example 6, the light guide 117 has the tapered FOP 119.

In the configurations of Example 3 (FIG. 4), Example 4 (FIG. 5), and Example 5 (FIG. 6), it is necessary to align the positions of the open region 113c of the shielding unit 113, the divided block 110a of the light guide 110, and the detection cell 111c of the light detector 111 with high accuracy.

The fiber diameter of the tapered FOP is, for example, several μm, and can be made sufficiently smaller than the size of the open region 113c of the shielding unit 113 and the detection cell 111c of the light detector 111. Therefore, in a case where the positions of the open region 113c of the shielding unit 113 and the detection cell 111c of the light detector 111 are aligned with high accuracy, it is not necessary to increase the alignment accuracy of the positions of FOPs 119. Thus, the assembly process and structure of the charged particle detection device 108g are simplified, and the manufacturing cost is reduced.

Example 8

FIG. 9 is a schematic diagram of a charged particle beam device 100b according to Example 8. Primary electrons 102 are extracted from the electron source 101. The charged particle beam device 100b has the scanning deflector 103 and the objective lens 104. The scanning deflector 103 and the objective lens 104 are arranged on the trajectory of the primary electrons 102.

The primary electrons 102 irradiate the sample 106 arranged on the sample transport stage 105. Signal electrons are emitted from the sample 106. The signal electrons include signal electrons 107a with a small reflection depth on the sample 106 and signal electrons 107b with a large reflection depth on the sample 106.

An E×B deflector 116 is disposed above the objective lens 104 to deflect the signal electrons according to the magnitude of the energy. The charged particle detection device 108 is provided in the advancing direction of the deflected signal electrons. Any of the charged particle detection devices according to Examples 1 to 7 can be used as the charged particle detection device 108.

The charged particle detection device 108 outputs a signal corresponding to the detected signal electrons. An observation image is formed on the monitor 121 by this signal being performed in synchronization with the scanning signal (the signal sent from the system control unit 120 to the scanning deflector 103).

The E×B deflector 116 is a deflector that utilizes the behavior of electrons in electric and magnetic fields, and has a function of deflecting the electrons (signal electrons) incident from below while not deflecting the electrons (primary electrons) incident from above. The signal electrons include backscattered electrons emitted from the sample as the primary electrons are reflected within the sample.

Backscattered electrons generally refer to electrons having an energy of 50 eV or more, and the magnitude of the energy varies depending on the reflection depth within the sample. The energy of backscattered electrons decreases as the reflection depth in the sample increases, and increases as the reflection depth decreases. The angle deflected by the E×B deflector varies depending on the magnitude of the energy of the electrons. The signal electrons 107a, which have a small reflection depth in the sample, have large energy and are deflected at a small angle, and the signal electrons 107b, which have a large reflection depth in the sample, have small energy and are deflected at a large angle.

Similarly to the position discrimination detection device (for example, according to Example 2), the charged particle detection device 108 of the charged particle beam device 100b of the present example corresponds to the incident position of the signal electrons on the incident surface of the scintillator, and the positions of the detection cells of the light detector can be discriminated.

Further, the position discrimination detection device can generally calculate the emission angle of the signal electrons from the sample based on the position of the detection cell of the light detector when the signal electrons are incident. Similarly to the charged particle detection device 108 of the charged particle beam device 100b of the present example, the deflection angle of the signal electrons by the E×B deflector 116 from the position of the detection cell of the light detector can be calculated.

Since the deflection angle by the E×B deflector 116 depends on the magnitude of the energy of the signal electrons, that is, the reflection depth, the reflection depth of the signal electrons can be calculated from the deflection angle by the E×B deflector 116.

As a result, the charged particle detection device 108 of the charged particle beam device 100b of the present example can detect signal electrons for each reflection depth based on the position of the detection cell of the light detector when the signal electrons are incident, and the reflection depth can be calculated.

In addition, by forming an observation image using only signal electrons of the same reflection depth, the observation image at a certain depth of the sample can be acquired, and an observation image at each depth can be acquired. By stacking them in order of reflection depth, a three-dimensional observation image of the sample can be acquired.

Example 9

Although the charged particle detection device and the charged particle beam device have been described in Examples 1 to 8, the present invention can also be applied to radiation devices and radiation detection devices. FIG. 10 is a schematic diagram of a radiation device 200 according to Example 9. FIG. 11 is a schematic diagram of a radiation detection device 203 of FIG. 10.

As shown in FIG. 10, the radiation device 200 includes a sample transport stage 105, an X-ray source 201 that irradiates the sample 106 on the sample transport stage 105 with radiation 202 (X-rays in the present example), and the radiation detection device 203 (an X-ray detection device in the present example) that detects X-rays that have passed through the sample 106.

As shown in FIG. 11, the radiation detection device 203 has the following configuration:
- the scintillator 109 including the fluorescent layer 109a that converts the radiation (X-rays in the present example), which is a detection target, into the light 112;
- a light detector 111 for detecting the light 112 emitted from the scintillator 109; and
- a light guide 110 provided between the scintillator 109 and the light detector 111.

The configuration of the scintillator 109 can be designed by those skilled in the art to match the radiation detection device 200 as appropriate. Moreover, except for the configuration of the scintillator 109, the configuration of the radiation detection device 203 can be the same as the charged particle detection device according to Examples 1 to 8.

Similarly to the charged particle detection device according to Examples 1 to 8, the radiation detection device 203 according to Example 9 can reduce crosstalk and avoid saturation.

In addition, each of the above-described examples is an example which is described in detail in order to make it easy to understand the present invention, and is not limited to a case where all of the described configurations are necessarily provided. In addition, a part of the configuration of a certain example can also be replaced with the configuration of other examples, and the configuration of the other example can also be added to the configuration of a certain example. In addition, it is possible to delete a part of the configuration of each example, and to replace a part of the configuration of each example with a part of another configuration.

REFERENCE SIGNS LIST 100a, 100b: charged particle beam device
101: electron source
102: primary electron
103: scanning deflector
104: objective lens
105: sample transport stage
106: sample
107, 107a, 107b: signal electron
108, 108a, 108b, 108c, 108d, 108e, 108f, 108g: charged particle detection device (detection device)
109: scintillator
109a: fluorescent layer
109b: collodion layer (resin layer)
109c: reflection layer
109d: incident surface
110: light guide
110a: divided block
111, 111b: light detector
111a detection surface
111c: detection cell
112: light
113, 114: shielding unit
113a: flat medium unit
113c: open region
115: resin
116: E×B deflector
117: light guide
118: central opening portion
119: FOP
120: system control unit
121: monitor
200: radiation device
201: X-ray source
200: radiation
203: radiation detection device (detection device)
d: shielding width
L: pitch
tb, ts: thickness

The invention claimed is:

1. A detection device that detects charged particles or radiation as detection targets, comprising:
   a scintillator including a fluorescent layer that converts the detection target into light;
   a light detector that detects light emitted from the scintillator;
   a light guide provided between the scintillator and the light detector, the light guide comprising a plurality of dividing blocks, a discontinuous surface being present at a boundary of each of the plurality of dividing blocks; and
   a shielding unit that partially shields at least one of the detection target incident on the scintillator and the light emitted from the scintillator, wherein
   the scintillator has an incident surface on which the detection target is incident and an emission surface from which the light is emitted,
   and the shielding unit is configured to divide the incident surface, a cross section, or the emission surface of the scintillator into a plurality of open regions,
   the shielding unit is provided inside the fluorescent layer,
   a thickness of the shielding unit is equal to or less than half a thickness of the fluorescent layer, and
   a position of the shielding unit corresponds to at least one of the boundaries of the plurality of dividing blocks.

2. The detection device according to claim 1, wherein the plurality of open regions are arranged in a radial direction and in a circumferential direction, or in a two-dimensional array shape.

3. The detection device according to claim 1, wherein the light guide has an incident surface on which the light is incident and an emission surface from which the light is emitted, and
   an area of the emission surface of the light guide is greater than an area of the incident surface of the light guide.

4. The detection device according to claim 1, wherein the fluorescent layer is formed using an inorganic powder fluorescent material,
   a median diameter of the powder fluorescent material is in a range of 1 μm to 50 μm, and
   the powder fluorescent material includes any of
   P47 ($Y_2SiO_5$:Ce),
   YAG or GGAG ((Y, Gd)$_3$(Al, Ga)$_5O_{12}$:Ce, (Y, Gd)$_3$(Al, Ga)$_5O_{12}$:Tb),
   YAP ($YAlO_3$:Ce),
   GOS ($Gd_2O_2S$:Pr, $Gd_2O_2S$:Ce, $Gd_2O_2S$:Tb).

5. The detection device according to claim 1, wherein the scintillator further includes a resin layer which is in contact with the fluorescent layer.

6. The detection device according to claim 5, wherein the resin layer contains nitrocellulose.

7. The detection device according to claim 1, wherein the shielding unit includes a light reflection layer.

8. The detection device according to claim 1, wherein the shielding unit is arranged between the scintillator and the light guide.

9. The detection device of claim 8, wherein the detection device includes a partial shielding layer arranged between the scintillator and the light guide, and the partial shielding layer includes the shielding unit and a flat medium unit that allows light to transmit therethrough.

10. The detection device according to claim 1, wherein the shielding unit is made of metal or resin.

11. The detection device according to claim 1, wherein light transmittance of the shielding unit is equal to or less than 60%.

12. The detection device according to claim 1, wherein a relationship between a shielding width d and a pitch L of the shielding unit satisfies $0.002\ L \le d \le 0.6\ L$.

13. The detection device according to claim 2, wherein a pitch of the shielding unit is equal to or less than 2 mm.

14. The detection device according to claim 1, wherein the shielding unit is made of a reflective or absorptive material, and the reflective or absorptive material includes at least one of titania, zirconia, alumina, ceria, tin oxide, zircon, iron oxide, zinc oxide, niobium oxide, silicon nitride, boron nitride, aluminum nitrate, silicon carbide, aluminum hydroxide, barium titanate, and diamond.

15. The detection device according to claim 7, wherein the light reflection layer is made of aluminum.

16. The detection device according to claim 1, wherein the light guide includes a fiber optic plate.

17. The detection device according to claim 3, wherein the scintillator includes an incident surface on which the detection target is incident, the light detector has an incident surface on which the light is incident, and an area ratio between the incident surface of the scintillator and the incident surface of the light detector is equal to an area ratio between the incident surface of the light guide and the emission surface of the light guide.

18. The detection device according to claim 1, wherein the scintillator includes an incident surface on which the detection target is incident, the light detector has an incident surface on which the light is incident, and an area of the incident surface of the light detector is equal to or less than 20 times an area of the incident surface of the scintillator.

19. The detection device according to claim 1, wherein the light guide includes a plurality of optical members and has a tapered shape, and an area of the emission surface of the light guide is greater than an area of the incident surface of the light guide.

* * * * *